United States Patent [19]
Trimberger

[11] Patent Number: 5,944,813
[45] Date of Patent: Aug. 31, 1999

[54] FPGA INPUT OUTPUT BUFFER WITH REGISTERED TRISTATE ENABLE

[75] Inventor: Stephen M. Trimberger, San Jose, Calif.

[73] Assignee: Xilinx, Inc., San Jose, Calif.

[21] Appl. No.: 08/840,560

[22] Filed: Apr. 8, 1997

Related U.S. Application Data

[62] Division of application No. 08/458,626, Jun. 2, 1995, Pat. No. 5,652,904, which is a continuation of application No. 08/102,011, Aug. 3, 1993, abandoned.

[51] Int. Cl.$^6$ ................................................ G06F 13/00
[52] U.S. Cl. .......................... 712/36; 710/56; 326/37; 326/56
[58] Field of Search ........................ 395/800.36, 872; 326/37, 38, 41, 56, 62

[56] References Cited

U.S. PATENT DOCUMENTS

| | | | |
|---|---|---|---|
| 4,124,899 | 11/1978 | Birkner et al. | 364/716 |
| 4,706,216 | 11/1987 | Carter | 365/94 |
| 4,758,745 | 7/1988 | Elgamal et al. | 307/465 |
| 4,847,612 | 7/1989 | Kaplinsky | 340/825 |
| 4,870,302 | 9/1989 | Freeman | 307/465 |
| 4,906,862 | 3/1990 | Itano et al. | 365/185.17 |
| 5,331,571 | 7/1994 | Aronoff | 364/490 |
| 5,361,373 | 11/1994 | Gilson | 395/800 |
| 5,363,494 | 11/1994 | Kudou | 395/306 |
| 5,428,800 | 6/1995 | Hsieh et al. | 326/82 |
| 5,444,393 | 8/1995 | Yoshinori t al. | 326/38 |
| 5,490,074 | 2/1996 | Agrawal et al. | 364/489 |
| 5,600,265 | 2/1997 | El Gamal et al. | 326/41 |
| 5,636,348 | 6/1997 | Buxton et al. | 395/285 |

OTHER PUBLICATIONS

Kuck, David J., "The Structures of Computers and Computations," 1978, John Wiley & Sons, pp. 279–357.

Monaghan et al., "Reconfigurable Special Purpose Hardware for Scientific Computation and Simulation," Sep. 1992, Computing and Control Engineering Journal, pp. 225–234.

Sawyer, et al., "Xilinx–The Third Generation," Mar. 1991, IEE Colloquim on User–Configurable Logic, Technology and Applications, pp. 1/1–7.

*Primary Examiner*—Meng-Ai T. An
*Assistant Examiner*—Walter D. Davis, Jr.
*Attorney, Agent, or Firm*—Edel M. Young; Kenneth E. Leeds

[57] ABSTRACT

In accordance with the present invention, an FPGA input/output buffer including at least two registers is provided. A first register provides the FPGA output through a tristate buffer to the pad or pin. A second register controls the state of the tristate buffer. By placing an address on address lines controlling the register clocks, any selected one of the input/output buffers can be accessed. In one embodiment, separate addresses are provided for loading a tristate control value into the second register and for loading data into the first register.

6 Claims, 9 Drawing Sheets

FPGA INPUT OUTPUT BUFFER WITH REGISTERED TRISTATE ENABLE

This application is a division of application Ser. No. 08/458,626, filed Jun. 2, 1995, now U.S. Pat. No. 5,652,904, which is a file wrapper continuation application of Ser. No. 08/102,011 filed Aug. 3, 1993, now abandoned.

FIELD OF THE INVENTION

The invention relates to field programmable integrated circuit logic devices or arrays (PLAs), such as those devices known as field programmable gate arrays (FPGAs) or erasable programmable logic devices (EPLDS)

BACKGROUND OF THE INVENTION

Programmable logic devices such as PLAs, PALs, ASICs, FPGAs and EPLDs are well known in the field. Such devices are described in such prior publications as Birkner, U.S. Pat. Nos. 4,124,899; Freeman, 4,870,302; Carter, 4,706,216; Elgamal et al., 4,758,745; and Kaplinsky, 4,847,612. All these patents are incorporated herein by reference. These devices all have hardware which can be programmably connected together to perform a logic function selected by a user. Once these devices have been programmed by the user, certain external pins serve as input pins, others pins serve as output pins and in some cases some serve as input/output pins. The device provides signals on the output pins in response to signals and combinations of signals placed on input pins as determined by the function which has been programmed into the device by the user.

Users employ these programmable devices to solve a wide variety of problems, and manufacturers have responded by offering a wide variety of device sizes and speeds as well as device designs. Some devices are optimized for speed, some for flexibility, some for complexity, and some for low cost. Typically higher speed, higher flexibility, and larger size are each associated with higher cost. With existing devices, high speed is typically provided and must be paid for whether the user needs it or not. Some users want a large number of signal pins but can tolerate low speed output buffers. No device with these characteristics has been available.

SUMMARY OF THE INVENTION

In accordance with the present invention, a microprocessor controlled device is provided which appears to a user to be a programmable logic device. Signals are taken from and placed on external pins in the same manner as would be done with a prior art programmable logic device. However, internal hardware which would be provided in a programmable logic device for performing the logic function is replaced by a microprocessor with associated memory. The microprocessor is programmable to read input signals from input pins, perform calculations related to the desired logic, and place signals on output pins. Thus the function of the microprocessor controlled device as it appears from observing signals on external pins is the same as that of a prior art FPGA or other logic device. However, internally, a program which has been stored in the memory associated with the microprocessor causes the microprocessor to serially read signals from external pins, perform the necessary calculations, and place signals onto output pins. For higher speed when the design is relatively large, more than one microprocessor is used. The plural microprocessors communicate with each other through shared data memory. In one embodiment, any given memory space can only be written to by one microprocessor but can be read by any microprocessor.

In accordance with a second aspect of the present invention, an FPGA input/output buffer including at least two registers is provided. A first register provides the FPGA output through a tristate buffer to the pad or pin. A second register controls the state of the tristate buffer. By placing an address on address lines controlling the register clocks, any selected one of the input/output buffers can be accessed. In one embodiment, separate addresses are provided for loading a tristate control value into the second register and for loading data into the first register.

DETAILED DESCRIPTION OF SOME EMBODIMENTS OF THE INVENTION

Figure 1:
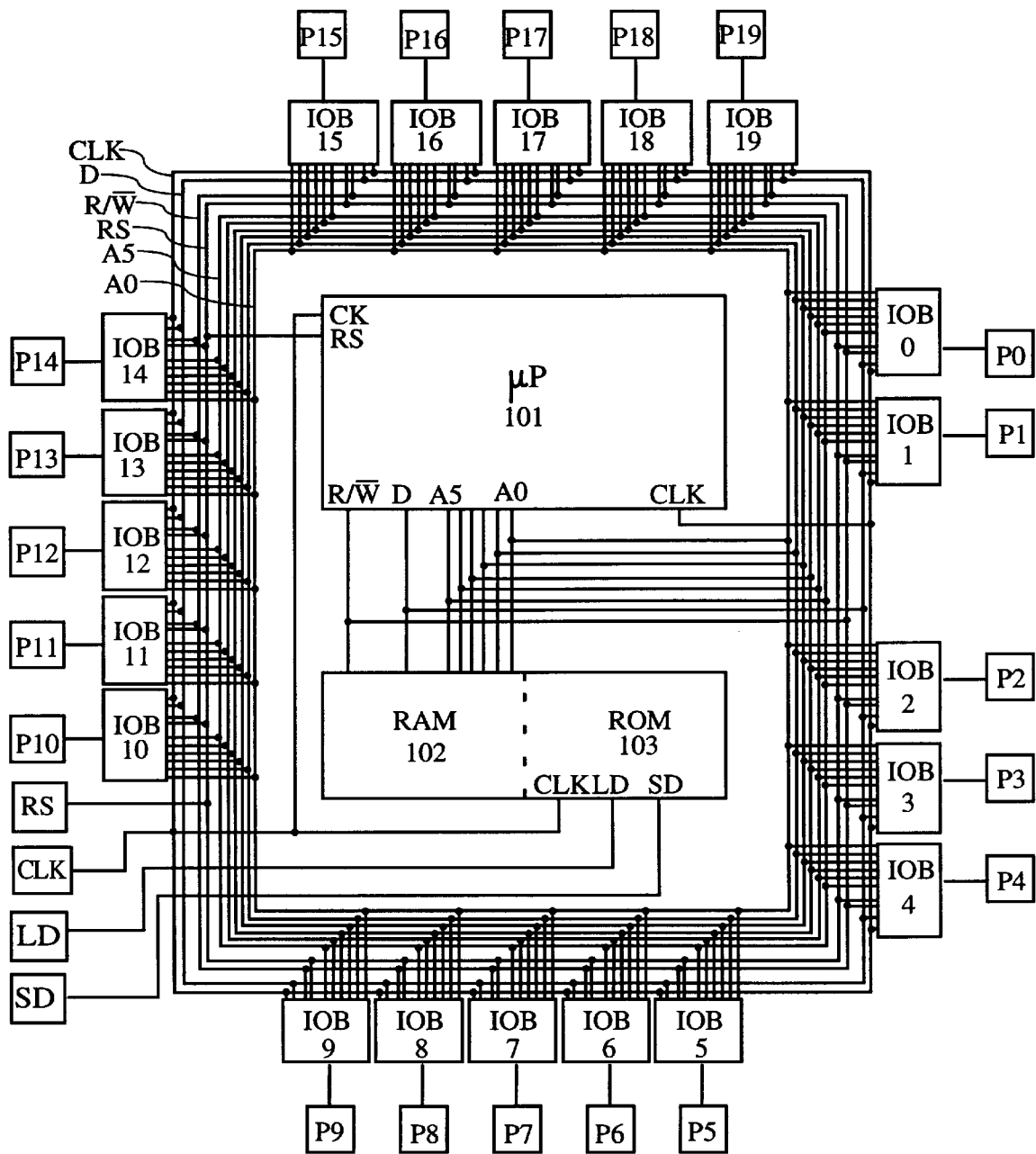
FIG. 1 shows one architecture of a microprocessor controlled logic device according to the present invention.

FIG. 1 shows the architecture of a microprocessor controlled device according to the present invention. Situated around the perimeter of the drawing are a plurality of pads (a pad is a conductive region of the integrated circuit chip which is connected to an external pin of the integrated circuit package). Each pad, and therefore each pin, is connected to an input/output buffer. For example, pad P3 is connected to input/output buffer IOB3. Each input/output buffer is connected to a bus having address lines, data lines, and other lines such as clock and reset lines. As shown in FIG. 1, the bus comprises address lines A0 through A5, bidirectional data line D, read/write signal line R/W, clock signal line CLK, and reset line RS. Microprocessor 101 is controlled by a program stored in ROM 103. As with other known programs and microprocessors, the program stored in ROM 103 instructs microprocessor 101 to operate on data, and optionally to jump to different memory locations to continue execution. Microprocessor 101 is clocked by external clock line CLK and accesses the bus through address lines A0 through A5, data line D and system clock line CLK. (The system clock line CLK carries a clock signal which drives microprocessor 101 and which is applied to flip flops in the IOBs. This CLK signal is different from clock signals which are typically part of a user's design for controlling various logic functions. The user's clock signal may be an order of magnitude slower than the system CLK signal depending upon the program stored in ROM 103.) The states of internal data signals not presented to an external pin are stored in RAM memory 102. Signals provided to I/O buffers may also be duplicated in RAM memory 102. The number of internal logic gates which can be simulated depends upon the amount of memory in ROM 102 for storing signals and the amount of memory in RAM 103 for storing instructions. The memory required in ROM 103 is only slightly more than one instruction per logic gate. As used in FIG. 1, the term ROM refers to memory which will be read by the microprocessor but not written to. This memory is no different physically from RAM 102; indeed no boundary need exist. ROM 103 merely refers to that portion of memory in which the instructions are stored and RAM 102 refers to that portion of memory in which data are stored. Relative sizes may vary from one configuration (set of instructions) to another.

The program stored in ROM 103 instructs microprocessor 101 to read or write to external pins periodically. Typically, the microprocessor reads and writes to internal memory locations in RAM 102 also. For example, if the microprocessor is operating at a clock speed of 100 MHz, the program may instruct it to read pin P3 every 10 cycles, to read pin P2 every 200 cycles, and to write to pin 4 after a particular sequence of events which may occur every 30 to 50 cycles. Thus at pin 3, the device appears to have a speed of 10 MHz, at pin P2 it appears to have a speed of 0.5 MHz and at pin 4 the device appears to have a speed of 2 MHz. These may be satisfactory speeds for the particular environment. And if speed at a pin is unacceptably slow, the program in ROM 103 may be revised to increase the apparent speed at certain pins.

There may also be more than one microprocessor so that parallel operations may take place to increase speed, as will be discussed below in connection with FIG. 5. In one embodiment, a system having a small number of microprocessors controls a subset of external pins with each microprocessor. The microprocessors communicate with each other through shared memory and/or internal communication lines. In a larger embodiment having many microprocessors, an internal multiprocessor bus is provided for the microprocessors to communicate with each other.

Figure 2A:
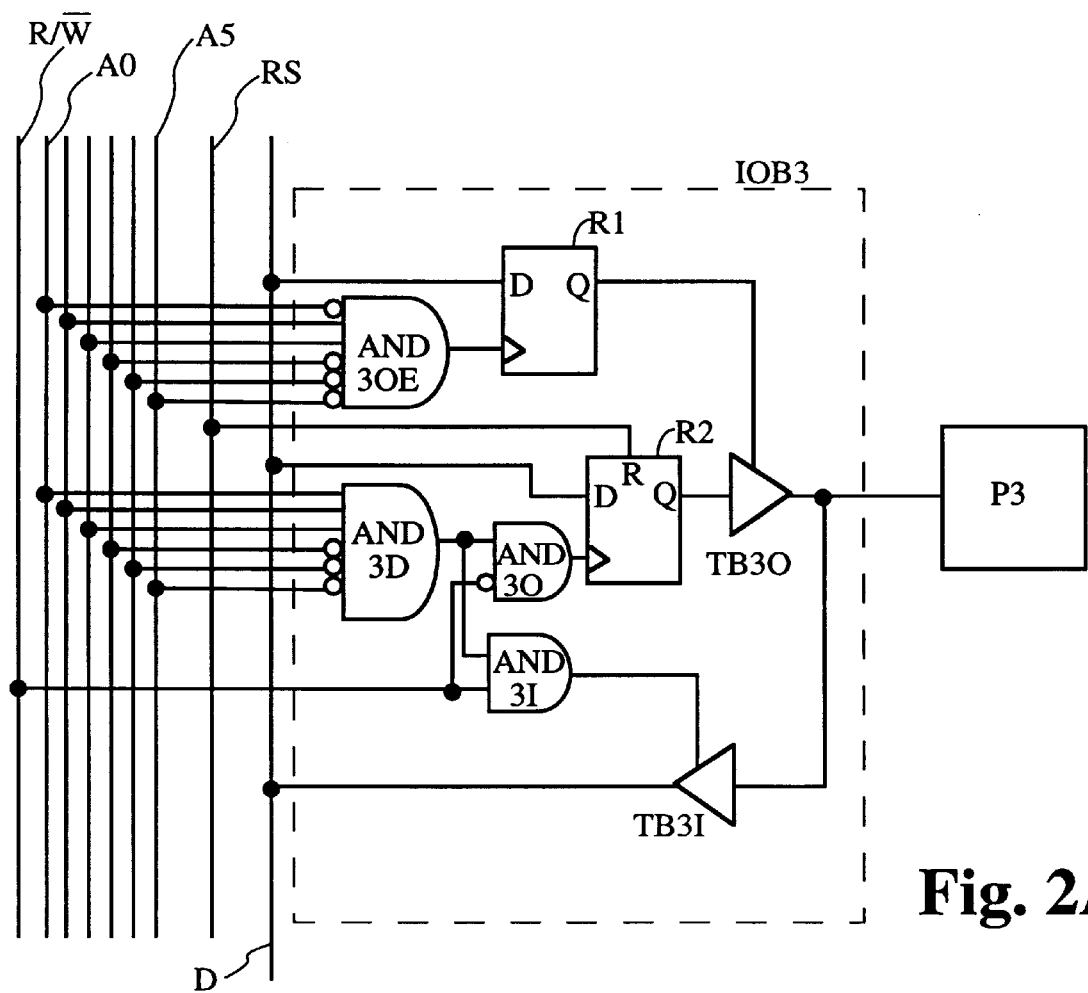
FIGS. 2A–2E show in detail several embodiments of the input/output buffers of FIG. 1.

FIG. 2A shows in detail a gated clock embodiment of input/output buffer IOB3 of FIG. 1. The IOBs of FIG. 1 may be identical, except that, as is well known in the art, each responds to a different address. In the embodiment of FIG. 2A, two registers, R1 and R2, are provided. Register R2 provides output through tristate buffer TB3O to pad or pin P3. Register R1 controls the state of tristate buffer TB3O. By placing an address on address lines A0 through A5, microprocessor 101 can address any selected one of the input/output buffers. In the embodiment of FIG. 2A, separate addresses are provided for loading a tristate control value into register R1 of IOB3 and for loading data into register R2 of IOB3. For example, as shown in FIG. 2A, microprocessor 101 can address register R1 with the address 000110 and can address register R2 with the address 000111. Address 000111 turns on AND gate AND3D only when read/write line R/$\overline{\text{W}}$ carries a logical 0, indicating that the data on line D are to be loaded into register R2 and therefore written to pin P3. Address 000111 turns on tristate buffer TB3I when read/write line R/$\overline{\text{W}}$ carries a logical 1, indicating that the value on pin P3 is to be placed onto data line D. When register R1 is addressed, AND gate AND3OE generates an upward going clock edge, causing the value on data line D to be loaded into register R1. If the value is a logical 1, register R1 turns on tristate buffer TB22, thus placing the data signal present in register R2 onto pin P3.

Figure 2B:
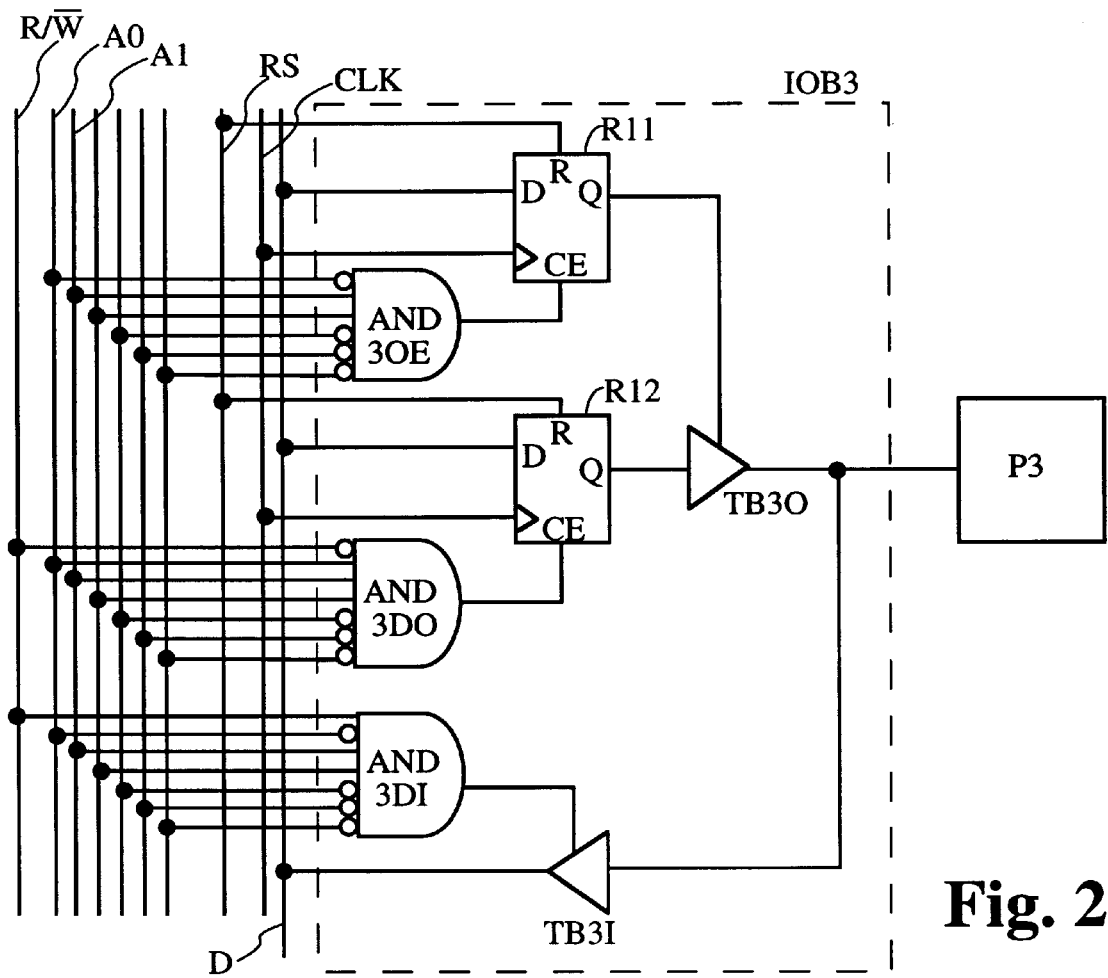

FIG. 2B shows an embodiment of an output buffer used with the present invention which does not use a gated clock signal. Registers R11 and R12 include clock enable port CE. This embodiment has the advantage over that of FIG. 2A of being able to provide a valid signal at the Q output as the CLK signal switches, so that it is not necessary to guarantee the desired signal is on line D at the moment register 12 is addressed.

The embodiment of FIG. 2A, on the other hand, has the advantage of requiring fewer components and being implemented in a smaller silicon area.

Figure 3A:
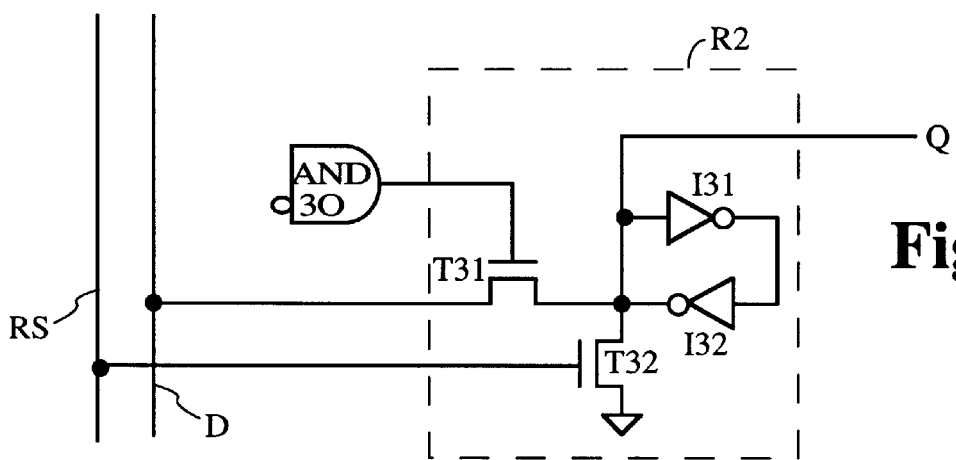
FIGS. 3A and 3B show embodiments of the storage device shown in FIGS. 2A and 2B respectively.

FIG. 3A shows a level-sensitive implementation of register R2 of FIG. 2A. Register R2 includes a five-transistor memory cell comprising inverters I31 and I32 connected into a storage loop and access transistor T31, which connects the storage loop to data line D. For reset, when line RS carries a logical 1, transistor T32 turns on and applies the logical 0 (ground) to the noninverting terminal of the loop. Thus only six transistors are used in register R2 (CMOS inverters I31 and I32 use two transistors each, as is well known).

Figure 3B:
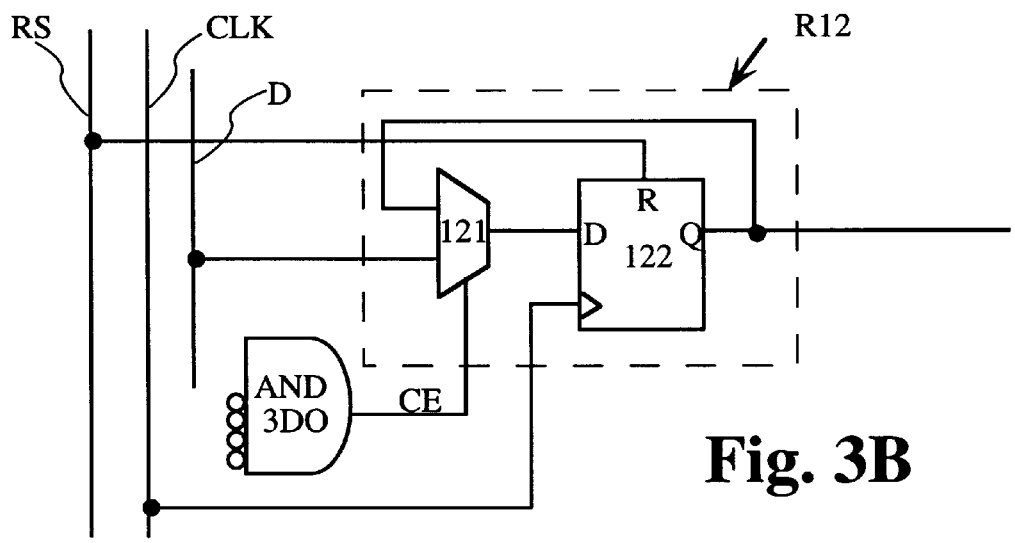

Register R12 of FIG. 2B is implemented as shown in FIG. 3B. Multiplexer 121 is controlled by the clock enable output signal CE from AND gate AND3DO to select between the disabled state of feeding back the output Q of register 122 to the D input of register 122, and the enabled state of supplying a data signal on line D to the D input of register 122. Thus, as long as register R12 is disabled, the Q output does not change in response to the clock signal regardless of whether data on line D changes. When register R12 is enabled, data on line D need be valid only upon the rising edge of the clock signal on line CLK. Timing of the clock signal is more certain than timing of the output of AND gate AND3D of FIG. 3A. Thus this embodiment is preferred when the data on line D cannot be guaranteed valid at the rising edge of the AND gate output but can be guaranteed valid at the rising edge of the clock signal.

Input/Output Buffer

Figure 2C:
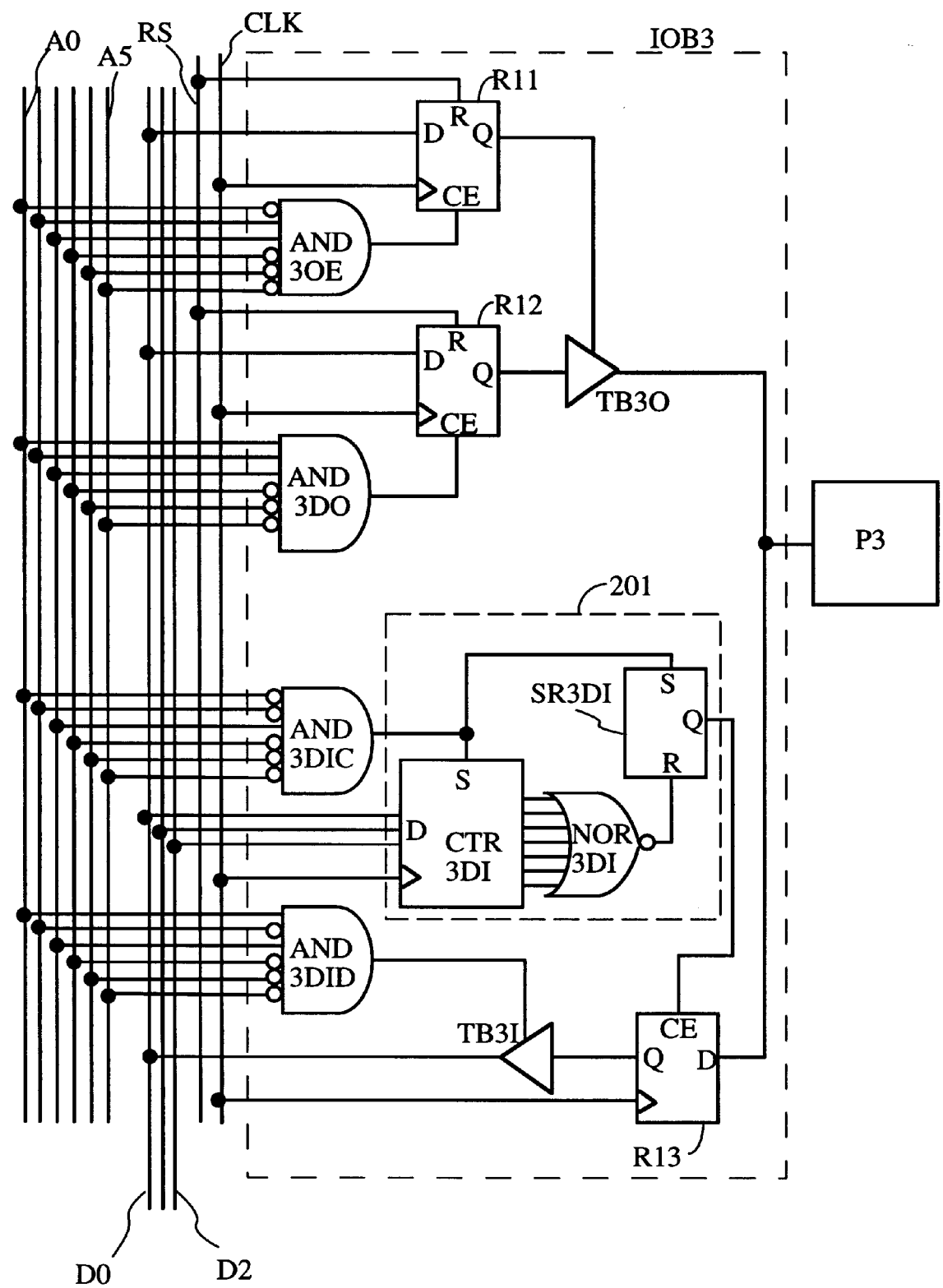

FIG. 2C shows an input/output buffer IOB3 which may switch dynamically from being an input buffer to being an output buffer. Separate addresses 000110 and 000111 respectively are provided via AND gates AND3OE and AND3DO for enabling the clock inputs of registers R11 and R12, which control the output function. Third and fourth addresses 000100 and 000101 are provided via AND gates AND3DIC and AND3DID respectively for addressing the input function. In this embodiment, no addresses are shared between input, output, and enable functions, therefore a R/$\overline{\text{W}}$ line such as shown in FIGS. 2A and 2B is not used.

Output

AND gate AND3OE of FIG. 2C addresses the clock enable input of register R1 so that when a high clock signal on line CLK is applied to the clock input of register R1, data on line D0 are transferred to the Q output of register R11. If the value on line D0 as the clock enable pin of register R11 is addressed is a logical 1, the Q output of register R11 turns on tristate buffer TB3O. Tristate buffer TB3O will remain on until register R1 is again addressed and a logical 0 signal on line D0 causes the Q output of register R11 to go low. While tristate buffer TB3O is on, the Q output of register R12 is applied to pin P3. Microprocessor 101 can change the value at pin P3 by addressing register R12 (decoded by AND gate AND3DO) while the new value is on line D0.

Input

Pin P3 can serve as either an input pin or an output pin. If tristate buffer TB3O is turned off and register R13 is enabled (setting set/reset flip flop SR3DI by addressing AND gate AND3DIC), an off-chip signal applied to pad P3 will be loaded into register R13 on the next cycle of system clock signal CLK. Microprocessor 101 (see FIG. 1) can read the value in register R13 by addressing tristate buffer TB3I (decoded by AND gate AND3DID), which causes data on the Q output line of register R13 to be placed on data line D0. Pin P3 can be switched between being an input pin and being an output pin by changing the value in register R11.

The embodiment of FIG. 2C allows pin P3 to serve as part of an input bus. An external bus can simultaneously apply data to several pins such as pin P3. Since a finite time is required for the microprocessor to retrieve all input values on pins such as P3, and these values may change before being retrieved, a structure is needed to capture the entire input bus value at one time. Thus, data applied to pin P3 are stored in register R13 at the next edge of clock signal CLK, and then transferred to the internal bus when the microprocessor addresses tristate buffer TB3I. In FIG. 2C, only 3 lines are shown as part of the internal bus, lines D0 through D2. However, any size bus may be provided in accordance with the present invention. A plurality of counters in different input/output blocks, such as counter CTR3DI in input/output block IOB3, are sequentially initialized by addressing means such as AND gate AND3DIC. A count value may be permanently programmed into counter CTR3DI or, as shown in FIG. 2C, signals are placed on the three lines D0 through D2 to indicate one of 8 possible count values. The selected count value is loaded into CTR3DI upon the next clock cycle. Counter CTR3DI then counts down to zero, whereupon NOR gate NOR3DI applies a high signal to the reset input R of set/reset latch SR3DI, causing set/reset latch SR3DI to place a low signal on the CE input of register R13. This causes register R13 to hold the value from pin P3 on its Q output. Subsequent changes to the signal on pin P3 are ignored. By sequentially loading different counts into sequential counters, all counters may be set to simultaneously capture values of their corresponding pins. Then at an appropriate time, buffers such as TB3I are sequentially addressed through address means such as AND3DID to place their corresponding values onto line D0. Alternatively, several pins can be addressed by the same address but which are connected to different data bus lines such as D0, D1, and D2. In this embodiment, the microprocessor reads all pin values simultaneously from the data bus.

Registers R11, R12, and R13 may be implemented as shown in FIG. 3B and discussed above in connection with FIG. 2B.

Byte-Wide Data Bus

Figure 2D:
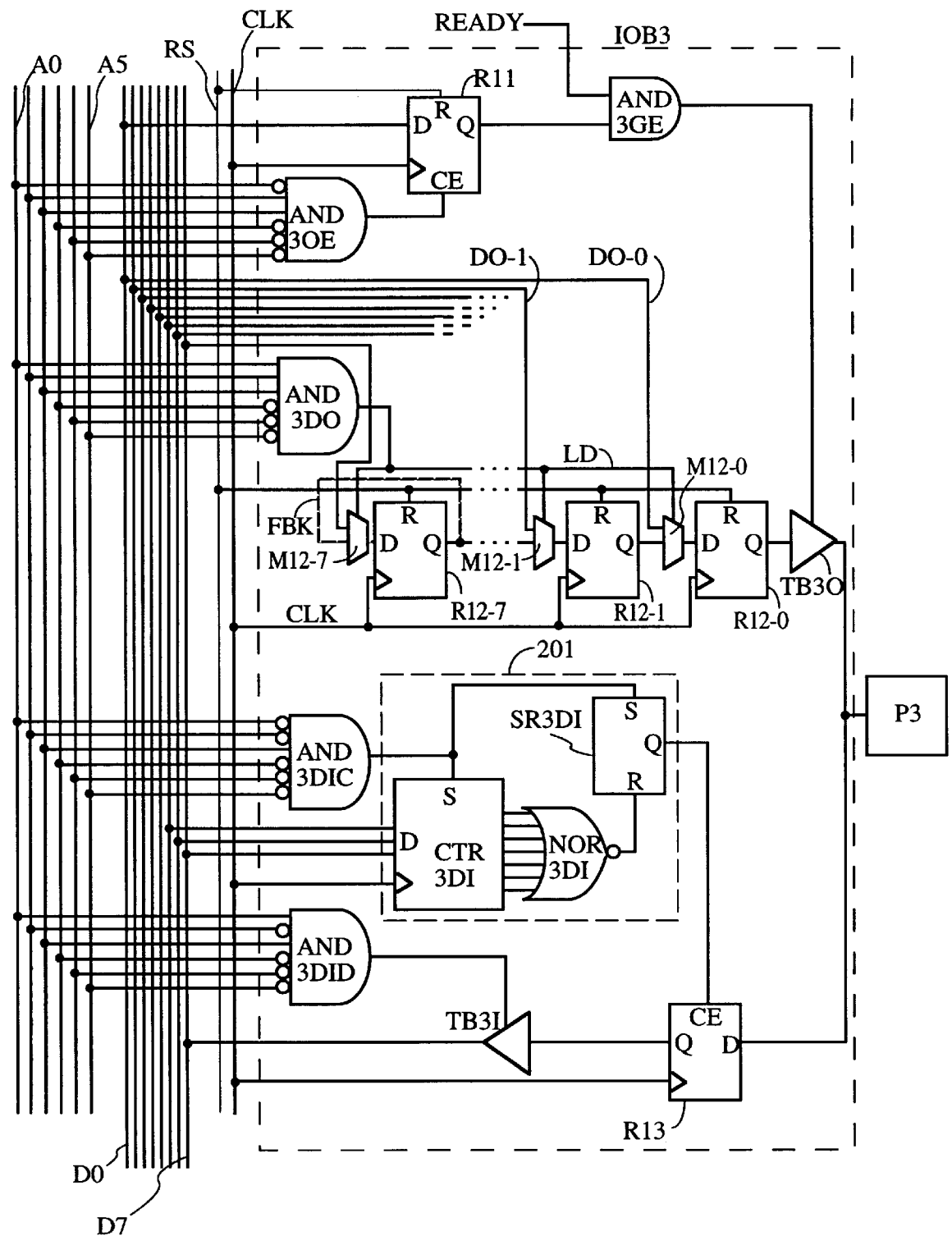

FIG. 2D shows another implementation of IOB3 for an embodiment in which data in RAM 102 are stored as 8-bit bytes accessed through a single address. Of course a wider bus width could also be provided. The output buffer of FIG. 2D is loaded with 8 bits in parallel and shifts the 8 bits output onto pin P3 in series. The input portion of FIG. 2D is the same as that of FIG. 2C.

In an architecture similar to that of FIG. 1, through six address lines A0 through A5, microprocessor 101 accesses 8 data lines D0 through D7 in RAM 102 instead of the single bit of data through line D shown in FIG. 1. These 8 data lines are illustrated in FIG. 2D. By enabling tristate output buffer TB3O with a high signal on the Q output of flip flop R11 (via data line D0), then placing the 8 data bits on data lines D0 through D7, and addressing AND gate AND3DO with the address 111000, (which places a high parallel-load signal on line LD when the CLK signal goes from low to high), microprocessor 101 causes multiplexers M12-0 through M12-7 to load the values on data lines D0 through D7 into registers R12-0 through R12-7 in parallel. As the system clock generates successive high and low CLK signals, the 8 bits in registers R12-0 through R12-7 are shifted out to pin P3 and to an external device. Thus microprocessor 101 can control 8 successive signals on pin P3 with only a single access to data lines D0 through D7 and three other lines. It may be desirable that the 8 data signals be shifted out to pin P3 at a slower or faster rate than the system clock rate. In such an embodiment, the CLK line shown in FIG. 2D is replaced with another clock signal line carrying a signal switching at a different rate. This other clock signal is typically divided from the system clock signal and in one embodiment is controlled by a user to divide by a selected number. Such flexibility is particularly useful when the user wishes to generate wave forms on a pin such as P3, and wants to control the frequency of the wave form with minimum attention from the microprocessor.

In a typical single-port microprocessor, access to memory values used in a single operation occurs sequentially. Thus, to evaluate a two-input gate, the microprocessor must address the two inputs in turn, then do the calculation, then write the result. This operation requires three memory accesses, therefore three memory clock cycles. To improve speed with which a microprocessor performs an operation, the microprocessor can be formed as a multi-port microprocessor. In the case of an operation using two inputs and one output, a three-port microprocessor can access all three ports and perform the function in a single clock cycle. A multiport microprocessor is discussed below in connection with a multi-processor chip.

Operation of Microprocessor FPGA

To program the microprocessor chip to act like a programmed FPGA, it is necessary to load a program into memory 103 (FIG. 1) which pulls the right signals off the pins at the right times, and puts the right signals onto certain pins at the right time.

Figure 4:
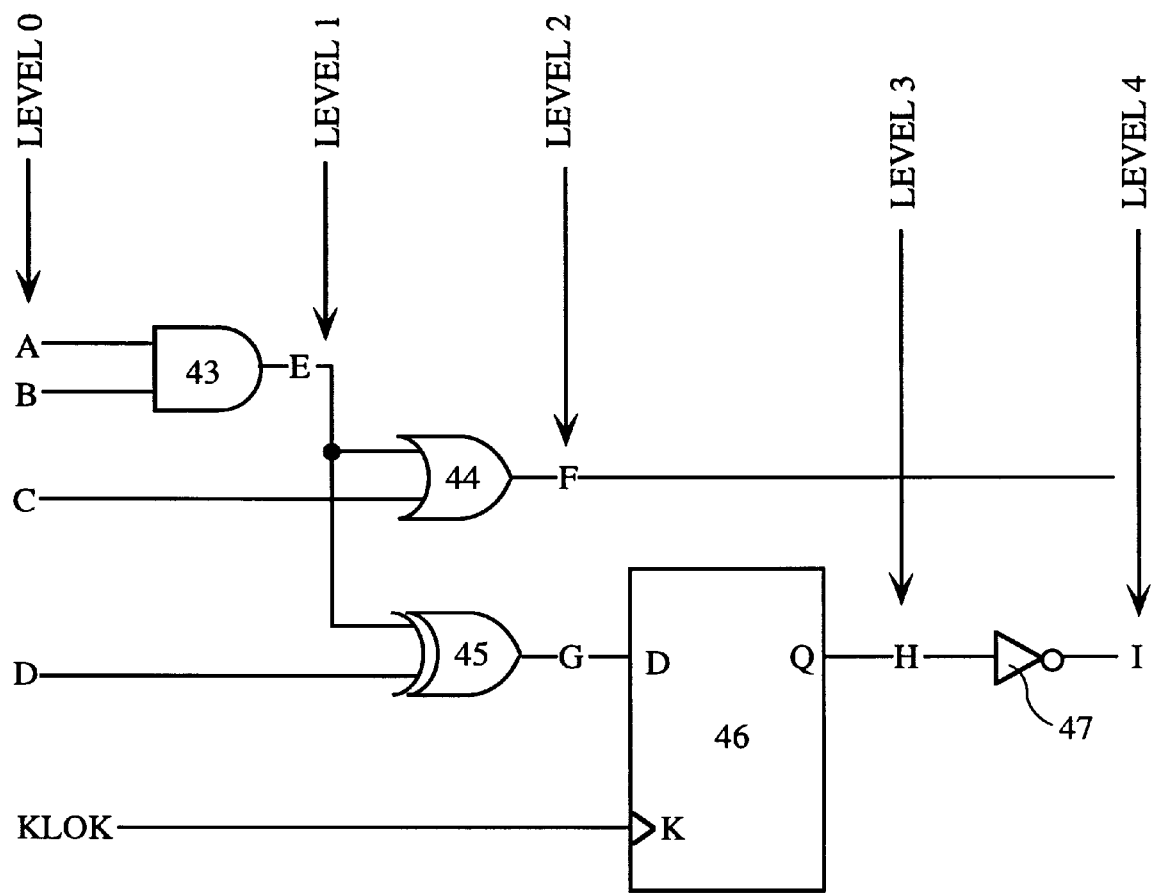
FIG. 4 shows an example logic function which is used to illustrate operation of the present invention.

FIG. 4 shows an example of a logic function to be implemented in the architecture of FIGS. 1 through 3B. In this example, the user has presented the information as a schematic diagram, though other logic design entry methods such as hardware description language input or state machine input may alternatively be used. And of course, much larger designs than shown in the example are possible and, indeed, typical.

Logic symbols in FIG. 4 are AND gate 43, OR gate 44, XOR gate 45, flip flop 46, and inverter 47. RAM memory 102 stores the internal states of signals in the logic diagram, instead of having an internal register in a programmable logic device store a bit, as was done with prior art FPGAs, for example. The user's design shown in FIG. 4 is compiled by a general purpose computer using a program which reads the description of the user's design (for example loading in a net list describing gates and connections of the user's design). The technique is known as "compiled-code simulations", and is well known. Where the design calls for an AND gate such as AND gate 43, the general purpose computer program writes an object code instruction to address the memory cell or external pin that contains the value on the first input line A, retrieve the value on input line A, address the memory cell or external pin that contains the value on the second input line B, retrieve the value on input line B, AND the two retrieved values, address the memory cell that is to contain the value of the output line, in this case the memory location for signal E, and SET the value in the memory location for signal E6, For simplicity, we will assume the values of input signals are stored in memory locations of the same names. Assuming signals A, B, C, and D are provided on external pins and not in memory, logic values E, G, H, and KLOK are stored in memory locations E, G, H, and KLOK of RAM 102. Logic values F and I, however, must be placed onto output pins. This is done by assigning them to the addresses of the I/O output flip flops or registers such as register R12 of FIG. 2C.

Four levels of logic are indicated in FIG. 4. That is, the logic function of the inputs A, B, C, D, and KLOK must be calculated in four stages, outputs of which are indicated as LEVEL 1, LEVEL 2, LEVEL 3, and LEVEL 4. In the first stage, the AND function 43 of logic values A and B, which are stored in memory cells A and B, must be calculated and stored as signal E, in memory cell E of RAM 102, before OR function 44 or XOR function 45 may be calculated. If the microprocessor includes the AND instruction in its instruction set, calculating the AND function of inputs A and B can be done in one machine instruction because the above steps for computing the AND function are performed by dedicated combinational hardware.

To get from LEVEL 1 to LEVEL 2, once signal E is available, OR function 44 and XOR function 45 may be calculated in either order since all inputs, C, D, and E are available when E becomes available. Preferably all functions AND, OR, XOR, flip flop, and INV shown in FIG. 4 are in the microprocessor instruction set (each is implemented by its own dedicated hardware) and can each be handled in a single instruction cycle.

To get from LEVEL 2 to LEVEL 3, the flip flop instruction to microprocessor 101 causes microprocessor 101 to move the data at its input location G to its output location H. To implement flip flop 46, the microprocessor may be programmed to switch the KLOK signal frequently to simulate a clock signal. Alternatively, the KLOK signal may be input to the chip or be the output of a combinational logic function calculated by the microprocessor but not shown in FIG. 4. In this respect the KLOK signal is like signals A, B, C, D, E, and G of FIG. 4. In the present case, movement of the value in G to location H may be programmed to occur as soon as the next system clock cycle (the CLK signal of FIG. 1) after the value KLOK changes from a low to a high value. After the KLOK value has been set to high, the output G of XOR gate 45, which is stored in memory cell G, is moved to memory cell H. Unlike the prior art hardware implementation, there is no possibility of a race condition in which the Q output on line H will be determined before the LEVEL 2 output G is stored in memory cell G, since microprocessor 101 carries out operations serially and will calculate G before calculating H. Each line in the logic diagram of FIG. 4 is assigned a memory location in RAM 102. The microprocessor takes the values indicated in FIG. 4 as A, B, C, and D and performs the steps indicated by the functions to generate values indicated by the output lines.

Table 1 shows the steps performed by microprocessor 101 to evaluate the logic function of FIG. 4.

TABLE 1

```
LOOP
    {
    INV   H -> I
    AND   A, B -> E
    OR    C, E -> F
    XOR   D, E -> G
    IF KLOK == 1 and LASTKLOK == 0
        {
        MOVE G -> H
        }
    LASTKLOK = KLOK
    }
```

In Table 1, evaluation of the flip flop output inversion "NOT" is handled first, by placing the complement of the value in memory location H into location I. (Alternatively, the inversion step may be handled last, as suggested in FIG. 4.) Next, the AND function of the values in locations A and B is calculated and placed in location E. Then the OR function of the values in locations C and E is sent to an input/output block F to be placed on the corresponding pin at the next clock cycle. The XOR function of the values at D and E is stored at location G. Preferably microprocessor 101 includes the popular logic operations AND, OR, NAND, NOR, XOR, XNOR, and NOT in its instruction set, so that each of these may be evaluated and stored in a single clock cycle. Next, the microprocessor tests the value KLOK and the value LASTKLOK, a test equivalent in hardware to detecting a flip flop clock signal going high. (The signal KLOK is a value currently stored in location KLOK. KLOK is a signal placed by a portion of the code not shown above, or alternatively an input to the chip. LASTKLOK is a variable added to this portion of the code by the general purpose computer compiler to facilitate sequential operations such as this.) Thus the steps listed in Table 1 implement the logic illustrated in FIG. 4.

A standard compiler decomposes each instruction in Table 1 into sequential steps. For example, the step "AND A, B→E" in Table 1 is decomposed into sequential steps of addressing A and retrieving the data, addressing B and retrieving the data, ANDing the two data values, and storing the result in C. (If the microprocessor is a multiport microprocessor, some of these operations may be performed simultaneously.) The standard compiler also translates certain instructions into those available in the instruction set. For example the instructions

```
    IF KLOK==1 AND LASTKLOK==0
    {
    MOVE G→H
    }
    LASTKLOK=KLOK
    }
``` of Table 1 are typically translated to

```
    IF KLOK≠1 OR LASTKLOK≠0, GOTO K
    MOVE G→H
    K:
    LASTKLOK=KLOK
    GOTO LOOP
```

Of course, since each calculation of a logic signal is done in sequence, the calculation of the logic function represented in FIG. 4 is much slower than the microprocessor clock rate. Assuming evaluating the IF statement requires two clock cycles, the above loop operation requires approximately 9 clock cycles. Thus the apparent speed of a device using a microprocessor according to the present invention to implement the logic of FIG. 4 is about one ninth the speed of the system clock. Thus, for a system clock of 100 MHz, the device speed is about 11 MHz. Such speed is fast enough for many applications. The microprocessor can be much smaller than the logic device elements it replaces. Therefore, the device of the present invention is considerably less expensive than the programmable logic device it replaces.

For large designs, the apparent speed is slower. However, the implementation can be speeded up by having the simulator write the program to detect changes and access a register only when a change has occurred. For example, the Table 1 step "INV H→I" can be moved so it is executed only after the step "MOVE G→H". Additional checks of signals besides flip flop outputs will also allow the microprocessor to skip the update of logic where input values have not changed.

Interrupt Driven Microprocessor

In some logic designs, certain pins must be serviced more rapidly than the rate which would occur if all input pins were read with equal frequency. As mentioned above, pins which must provide faster response can be read more frequently. However, reading some pins frequently takes microprocessor cycles away from other function and may undesirably slow the overall chip performance. If a pin changes value relatively infrequently, frequent checking produces change only infrequently. Another alternative is to use an interrupt mechanism to detect when the signal on a pin has changed.

Figure 2E:
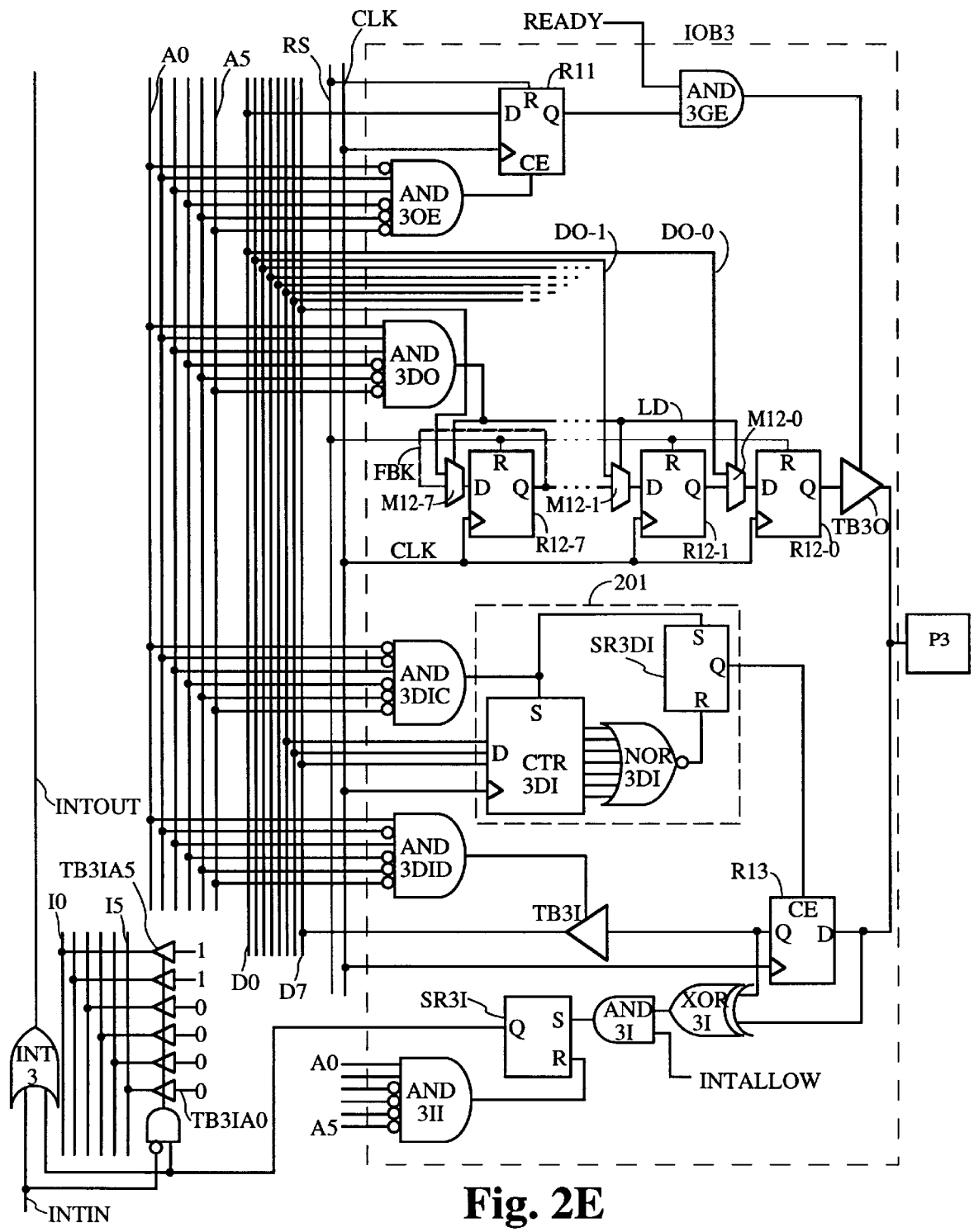

FIG. 2E shows an embodiment of input/output block IOB3 for use with an interrupt driven microprocessor. An interrupt line and interrupt bus are added to the chip, and are connected to the input structure as shown in FIG. 2D.

Also added to input/output block IOB3 are change detecting XOR gate XOR3I, interrupt allowing gate AND3I, set/reset latch SR3I, reset gate AND3IR, tristate control AND gate TC3I, tristate buffers TB3IA0 through TB3IA5, and interrupt signal accumulator INT3.

XOR gate XOR3I detects a change in the value of pin P3 by comparing the Q output of register R13 to the value on pin P3. A difference in these values causes XOR gate XOR3I to output a logical 1. Interrupt allowing AND gate AND3I passes the output of XOR gate 3I to set/reset latch SR3I if enabled by the INTALLOW signal. This INTALLOW signal may be a global signal, a signal applied to a group of pin inputs, or the output of another register which is addressed from the address bus in the manner that register R11 is addressed.

If the INTALLOW signal is high, the high signal on the output of XOR gate SOR3I will cause set/reset latch SR3I to output a high interrupt signal. This high signal causes a high signal on the interrupt line. The interrupt line is shown in FIG. 2E as line INTIN and line INTOUT connected by interrupt OR gate INT3. A high signal on line INT3IN or a high signal on line INTIN causes OR gate INT3 to place a high signal on line INTOUT. Gates equivalent to OR gate INT3 are provided for each pin which can generate an interrupt, and connected together, for example in a string or in a tree structure to generate a high interrupt signal to the microprocessor when any interrupt driving pin has changed value. Other structures for interrupt signalling are possible, such as a wired-AND interrupt signal.

A high signal on line INT3IN also enables AND gate TC3I. If another pin upstream from OR gate INT3 has produced a high INTIN signal, AND gate TC3I does not turn on tristate buffers TB3IA0 through TB3IA5. However, if no upstream pin is generating an interrupt signal, AND gate TC3I generates a high output signal, which causes tristate buffers TB3IA0 through TB3IA5 to place the interrupt address of pin P3 onto the interrupt bus comprising lines I0 through I5.

When the microprocessor detects the interrupt signal, it saves its current program counter and other internal states, and branches to the code that handles the interrupt for the pin. Handling the interrupt may include evaluating a function based on the changed value and result in writing new values to other pins. The actions performed in response to an interrupt for a given pin are decided by a user, who may identify subsets of pins that are to be interrupt-enabled, and parts of a design which respond to the interrupt. Alternatively, interrupt responses may be selected by a compiler which converts a user's design into a set of microprocessor instructions.

As shown in FIG. 2E, the address 000011 is the same as the address decoded by AND gate AND3IR for set/reset latch SR3I. Alternatively, the address may be the label of pin P3 (00011) or any other unique address.

After receiving and processing an interrupt as initiated by set/reset latch SR3I, the microprocessor addresses AND gate AND3IR to reset set/reset latch SR3I. It is important that the address of AND gate AND3IR be different from the address of AND gate AND3DID since these decoders are on the same address bus.

When the microprocessor has handled all active interrupts, it returns to the calculations specified in the instructions which were loaded into its instruction space. The behavior of the microprocessor in handling interrupts follows a conventional sequence of steps used by conventional microprocessors in handling interrupts. Such steps are discussed by David J. Kuck in *The Structures of Computers and Computation* published in 1978 by John Wiley & Sons, at pages 279–357.

In a large implementation of the invention, several pins may share the same interrupt address and reset address. This shortens the number of gates through which an interrupt signal must pass, reduces the interrupt bus width, and reduces the memory required to store interrupt vectors, but limits the flexibility with which signals on individual pins can be processed.

Multiple Microprocessor Embodiment

In designs which are large enough that the speed of a microprocessor would not be sufficient to handle many instructions with sufficient apparent clock speed, and which are still of a type not requiring a typical FPGA, several microprocessors may be incorporated into one chip.

Figure 5:
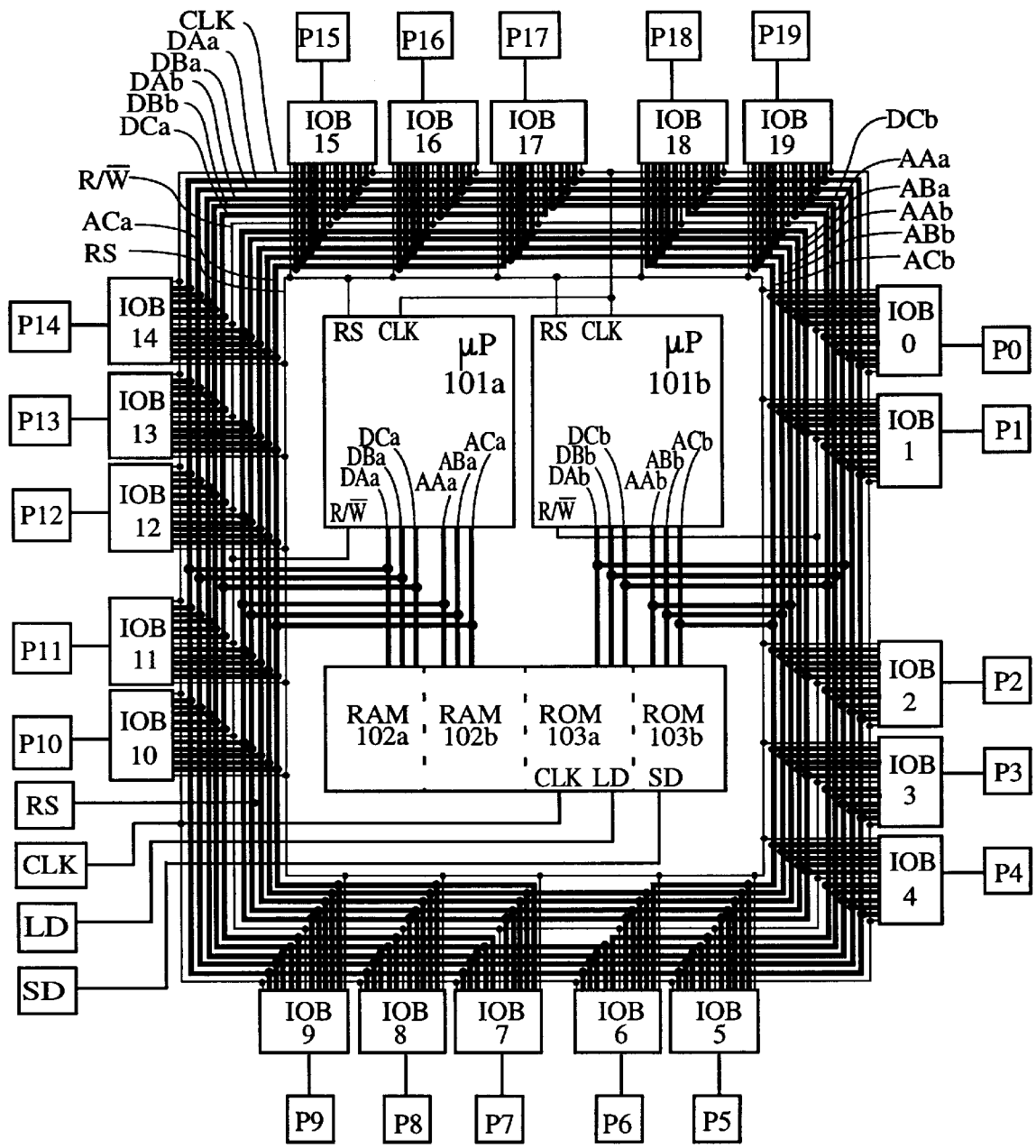
FIG. 5 shows an architecture of a microprocessor controlled logic device which uses two microprocessors.

FIG. 5 shows an architecture in which two microprocessors 101a and 101b are provided. These two microprocessors communicate with each other through shared memory 102a and 102b. Both microprocessors can read the entire memory space 102a and 102b. However, only one microprocessor can write to any particular memory location. In the present case microprocessor 101a can write to memory space 102a and microprocessor 101b can write to memory space 102b. In one embodiment, selection of which memory spaces can be written to by which microprocessor is determined by which microprocessor has access to the write port of which memory cell. (This embodiment is discussed below in connection with FIG. 7). In another embodiment, write ports are provided to most or all memory cells from both microprocessors 101a and 101b, and selection is controlled by the program stored in instruction space 103. This many-reader-single-writer requirement is similar in function to the well known hardware design requirement that several devices may be driven by a given line but only one output driver may apply a signal to a given line. In the hardware case the requirement avoids contention (two drivers applying different voltages to the same line), while allowing fanout. In the present multi-processor case, the rule avoids unpredictability about the value in a particular memory location, yet allows multiple microprocessors to communicate through shared memory.

In the example of FIG. 5, the instructions in instruction space 103 are separated into instruction space 103a which controls microprocessor 101a and instruction space 103b, which controls microprocessor 103b. It is not necessary that the two instruction spaces be of equal size or that instruction space 103 be physically different from data space 102. As before, instruction spaces 103a and 103b are portions of memory loaded from an external source. The instructions establish the chip configuration (define the logic the chip will emulate). Neither microprocessor may write to instruction space 103. Instruction space 103 may be protected from being overwritten by having write ports accessible to external pins only, as shown in FIG. 1. Alternatively, the compiler used to generate the instructions may establish the size of the instruction space and assure that no write instructions access the space allocated for instructions.

To perform an operation having two inputs and one output in a single cycle, a microprocessor must access the two inputs simultaneously and this requires the microprocessor to have two input ports. To output the value in the same cycle typically requires a third port, although one input can be read on a rising clock edge and an output can be sent to the same port on a falling edge, so that a single port can be used for both read and write in the same clock cycle. If there is a possibility that a memory cell will be both read and written to in the same clock cycle, a possible race condition in which the changed value is again read and changed on the same clock cycle can be avoided by reading the input values asynchronously as soon as the instruction is received) and writing the new value on a clock edge.

If the microprocessor is to have two read ports, the memory cell must also have two read ports so the microprocessor can select which port the value in the memory cell will be placed on. In the present embodiment, each microprocessor has two input ports and one output port. The two microprocessors access the same memory cell, therefore the memory cell must have four ports for input to the microprocessors. A fifth memory cell port can be used for writing since only one of the microprocessors can write to any given memory cell.

Figures 6, 7:
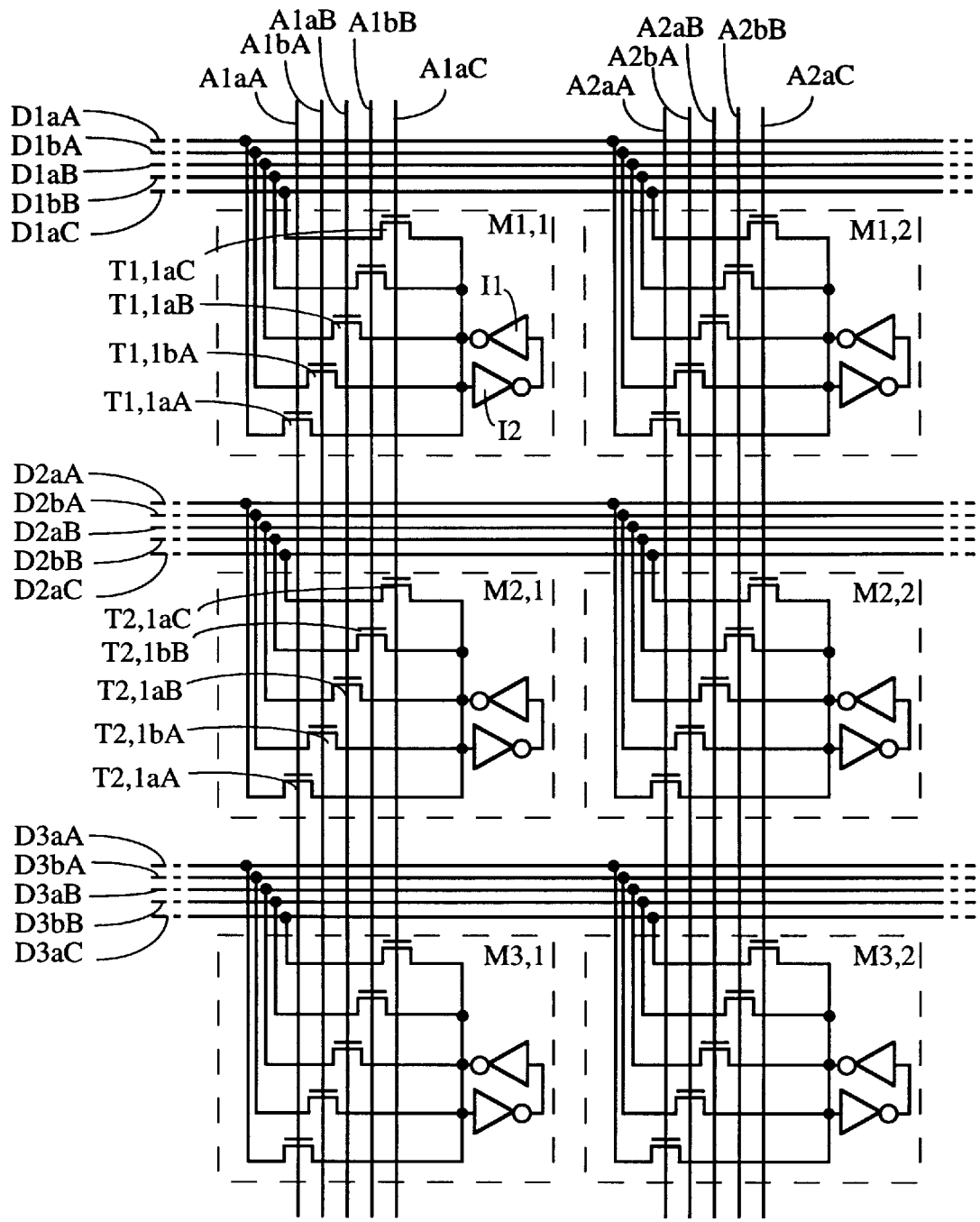
FIG. 6 shows an instruction word format for controlling a microprocessor such as shown in FIG. 5.
FIG. 7 shows a memory portion of the microprocessor-associated memory, with related access circuitry for the embodiment of FIG. 5.

FIG. 6 shows the format of an instruction provided to each microprocessor to identify two inputs, an output, and an operation. Included in the instruction of FIG. 6 is a function F to be performed by the microprocessor (typically including Boolean functions, arithmetic functions, shift, invert, for example, at least some of the functions able to be performed on single-bit inputs and multiple-bit inputs), the address (including row and column addresses) of the data to be input to the A port, the address of the data to be input to the B port, and the address to which the output is to be written. The microprocessor responds by addressing decoders to reach the identified memory cells. As is well known in the microprocessor and memory arts, decoders addressed by the microprocessors select which address line will be pulled high in response to a particular address from a microprocessor and which data line will be read or written in response to a particular address from a microprocessor. Separate decoders are provided for each port and each microprocessor. Thus each row and each column includes five decoders. Since decoders are well known, they are not shown here.

Returning to FIG. 5, each microprocessor has three address buses AA, AB, and AC, and three data buses DA, DB, and DC, which are accessed in response to an instruction of the format shown in FIG. 6. Buses from microprocessor 101a have the label a and buses from microprocessor 101b have the label b. Address buses AAa and ABa and data buses DAa and DBa of microprocessor 101a are for reading, and access both RAMs 102a and 102b. Likewise, address buses AAb and ABb and data buses DAb and DBb of microprocessor 101b access both RAMs 102a and 102b. In addition, address buses AAa, ABa, AAb, and ABb and data buses DAa, DBa, DAb, and DBb access all I/O blocks IOB0 through IOB19. However, address buses ACa and data bus ACa of microprocessor 102a are for writing, and access only RAM 102a while address bus ACb and data bus DCb of microprocessor 102b access only RAM 102b. Address bus ACa and data bus DCa of microprocessor 101a access I/O block IOB7 through IOB17 while address bus ACb and data bus DCb of microprocessor 101b access I/O blocks IOB18, IOB19 and IOB0 through IOB6. Thus each I/O block and each memory cell can be read by either microprocessor and written to by only one microprocessor. The two microprocessors operate in parallel, simultaneously executing instructions stored in ROMs 103a and 103b, and thus achieve up to twice the speed of a single microprocessor.

Of course in other embodiments other divisions can be made. Importantly, this invention is not limited to two microprocessors. An embodiment having 32 microprocessors, or other larger number, can also be provided using the principles described here of dividing the positions accessed between multiple microprocessors, and providing different sets of instructions for the different microprocessors.

Large numbers of microprocessors imply large numbers of address and data lines. To limit the number of address and data lines in a many-processor embodiment, the microprocessors may share some of the address and data lines. The microprocessors may have some unshared memory (efficient but not usable for communicating with other microprocessors), some memory shared with a small number of other microprocessors, and some memory shared with all other microprocessors (expensive in amount of interconnect structure).

Alternatively multiple microprocessors may communicate with each other through a shared bus. Information passed this way includes changes in data values used by more than one microprocessor. For such an embodiment, the instructions must take into account the schedule of bus access by other microprocessors. Avoidance of bus contention can be achieved by appropriate scheduling for the microprocessors. Alternatively, avoidance of bus contention may be assured by hardware which handles bus requests and grants.

FIG. 7 shows a memory structure for RAM 102a. Six memory cells M1,1 through M3,2 are illustrated, though of course many more are provided in an actual device. The memory cells are arranged in rows and columns, with a set of data lines for accessing each row, and a set of address lines for accessing each column. Each memory cell comprises a pair of inverters I1 and I2 connected in a loop. These are labeled only in memory cell M1,1. This is a multi-port memory in that the memory cells can be accessed through five address lines and five data lines for working with multiport microprocessors. Address lines having a small "a" in the label are accessed by microprocessor 101a and address lines having a small "b" in the label are accessed by microprocessor 101b. Address lines having a label ending with a large "A" cause data to be placed on the A input port of the respective microprocessor, whereas address lines having a label ending with a large "B" cause data to be placed on the B input port of the respective microprocessor. Address lines having a label ending with a large "C" cause data output from the microprocessor and placed on the corresponding data line to be written to the corresponding memory cell. The value stored in a memory cell such as memory cell M1,1 may be accessed through any of five ports controlled by five corresponding transistors. For example, a high signal on line A1aA turns on transistor T1,1aA, which places the value in memory cell M1,1 onto data line D1aA. A high signal on line A1aA also turns on transistor T2,1aA and other transistors in the same column. Note that the portion of memory 102a shown in FIG. 7 can not be written by microprocessor 101b. However microprocessor 101b can read values from memory 102a and can place results of computations in memory 102b, which can be read but not written by microprocessor 101a.

If microprocessor 101a is instructed to determine the AND function of values in locations M1,1 and M2,1 and place the result in location M3,1, the instruction in memory 103 according to the format in FIG. 6 is 0001 000000 000000 000000 000001 000000 000010

This instruction breaks down as follows:

| | |
|---|---|
| 0001 | Generate a logical 1 output only if both inputs are logical 1 (the AND function). |
| 000000 | For the A input port, address column 1 (A1aA in FIG. 7) |
| 000000 | For the A input port, address data in row 1 (D1aA) |
| 000000 | For the B input port, address column 1 (A1aB) |
| 000001 | For the B input port, address data in row 2 (D2aB) |
| 000000 | For the C output port, address column 1 (A1aC) |
| 000010 | For the C output port, load data from row 3 (D3aC) |

In response to this instruction, microprocessor 101*a* addresses lines A1aA and D1aA for placing the first input from cell M1,1 on its A input port and addresses lines A1aB and D2aB for placing the second input from cell M2,1 on its B input port. The function bits 0001 are a truth table for the AND function. Note that four bits serve as a truth table for all 16 combinational functions of two inputs. Thus these four instruction bits are addressed by the values input to the A and B input ports of microprocessor 101*a* and provide the output value to be placed on the C output port. Microprocessor 101*a* addresses lines A1aC and D3aC for writing the result of the AND function to memory cell M3,1. During the same clock cycle in which microprocessor 101*a* is carrying out this instruction, microprocessor 101*b* is carrying out another instruction which may result in simultaneously writing a value to a memory cell in region 102*b* but will not result in writing a value to a memory cell in region 102*a*.

Included among the locations to which microprocessors 101*a* and 101*b* write are the input/output buffers around the perimeter of the chip. Each of these I/O buffers will be written to by only one microprocessor. In the embodiment shown in FIG. 5, the hardware allows only one microprocessor to write to a particular I/O buffer. In another embodiment, both microprocessors may access all I/O buffers and all internal memory cells for writing, and the instructions in memory 103 control which microprocessor writes to which I/O buffer. In such an embodiment, writing control of I/O buffers and internal memory may pass back and forth between the two microprocessors if that has been specified in the instructions in memory 103.

The above discussion of multiport microprocessors has used the example of three-port microprocessors in which two ports are for input and one is for output. This is a common implementation of multi-port microprocessors. However, the present invention can advantageously use microprocessors having additional ports. For example, if a device is to be optimized for three-input or four-input functions, a three- or four-input-port microprocessor can be provided. The memory has a corresponding number of ports. If several microprocessors are used, the memory, or a part of the memory, has ports for accessing one or more of the microprocessors, as discussed above for the two-input-port example.

I claim:

1. An input output buffer for an FPGA, comprising:

a pad;

a tristate buffer optionally driving said pad and having a tristate control terminal;

a first flip-flop providing an output signal through said tristate buffer to said pad; and a second flip-flop providing a signal to said tristate control terminal for controlling impedance of said tristate buffer.

2. The input output buffer of claim 1, wherein said first and second flip-flops are addressable.

3. The input output buffer of claim 1, wherein said first and second flip-flops are separately addressable.

4. The input output buffer of claim 1, further comprising:

a third flip-flop driven by said pad and optionally providing an input signal to said FPGA.

5. The input output buffer of claim 4, wherein said first, second, and third flip-flops are addressable.

6. The input output buffer of claim 4, wherein said first, second, and third flip-flops are separately addressable.

* * * * *